United States Patent
Cheng et al.

(10) Patent No.: US 8,580,646 B2
(45) Date of Patent: Nov. 12, 2013

(54) METHOD OF FABRICATING FIELD EFFECT TRANSISTORS WITH LOW K SIDEWALL SPACERS

(75) Inventors: Kangguo Cheng, Guilderland, NY (US); Louis Lu-Chen Hsu, Fishkill, NY (US); Jack A. Mandelman, Essex Junction, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 12/948,805

(22) Filed: Nov. 18, 2010

(65) Prior Publication Data

US 2012/0126342 A1    May 24, 2012

(51) Int. Cl.
   *H01L 21/336*    (2006.01)
   *H01L 21/331*    (2006.01)
   *H01L 21/425*    (2006.01)
   *H01L 21/26*     (2006.01)
   *H01L 21/42*     (2006.01)

(52) U.S. Cl.
   USPC ........... 438/303; 438/302; 438/306; 438/308; 438/369; 438/372; 438/373; 438/378; 438/530; 438/535

(58) Field of Classification Search
   None
   See application file for complete search history.

(56) References Cited

U.S. PATENT DOCUMENTS

| | | | |
|---|---|---|---|
| 6,107,667 A | 8/2000 | An et al. | |
| 6,225,176 B1 * | 5/2001 | Yu | 438/305 |
| 6,297,115 B1 | 10/2001 | Yu | |
| 6,348,385 B1 | 2/2002 | Cha et al. | |
| 6,423,384 B1 | 7/2002 | Khazeni et al. | |
| 6,492,249 B2 | 12/2002 | Xiang et al. | |
| 6,720,213 B1 | 4/2004 | Gambino et al. | |
| 7,253,123 B2 | 8/2007 | Arghavani et al. | |
| 7,534,674 B2 | 5/2009 | Goktepeli et al. | |
| 7,678,634 B2 | 3/2010 | Ouyang et al. | |
| 7,682,917 B2 | 3/2010 | Bedell et al. | |
| 2003/0038305 A1 | 2/2003 | Wasshuber | |
| 2005/0074956 A1 | 4/2005 | Autryve et al. | |
| 2005/0074986 A1 | 4/2005 | Autryve et al. | |
| 2005/0260819 A1 * | 11/2005 | Belyansky et al. | 438/305 |
| 2006/0205192 A1 * | 9/2006 | Walther et al. | 438/513 |
| 2007/0202640 A1 | 8/2007 | Al-Bayati et al. | |
| 2007/0238254 A1 | 10/2007 | Ordonio | |
| 2008/0081471 A1 * | 4/2008 | Press et al. | 438/682 |
| 2008/0093666 A1 * | 4/2008 | Okayama | 257/338 |
| 2008/0242041 A1 * | 10/2008 | Chakravarti et al. | 438/305 |
| 2011/0254138 A1 * | 10/2011 | Babich et al. | 257/629 |

* cited by examiner

*Primary Examiner* — Michael Jung
(74) *Attorney, Agent, or Firm* — Schmeiser, Olsen & Watts; Michael LeStrange

(57) ABSTRACT

Field effect transistors and method for forming filed effect transistors. The field effect transistors including: a gate dielectric on a channel region in a semiconductor substrate; a gate electrode on the gate dielectric; respective source/drains in the substrate on opposite sides of the channel region; sidewall spacers on opposite sides of the gate electrode proximate to the source/drains; and wherein the sidewall spacers comprise a material having a dielectric constant lower than that of silicon dioxide and capable of absorbing laser radiation.

23 Claims, 10 Drawing Sheets

METHOD OF FABRICATING FIELD EFFECT TRANSISTORS WITH LOW K SIDEWALL SPACERS

FIELD OF THE INVENTION

The present invention relates to the field of semiconductor devices and methods of fabricating semiconductor devices; more specifically, it relates to field effect transistors with low-k sidewall spacers and the method of fabricating field effect transistors with low-k sidewall spacers.

BACKGROUND

A metal-oxide-semiconductor (MOS) field effect transistor (FET) comprises a gate electrode separated from a semiconductor substrate by a gate dielectric which is above a channel region in the substrate. A source region and a drain region are located at the ends of the channel region. The "ON" or "OFF" states of the transistor is controlled by the voltage applied at the gate electrode. Sidewall spacers are formed at the sidewalls of the gate electrodes to isolate the gate electrode from the source/drain (S/D) contacts. The parasitic capacitance between the gate and the S/D contacts adversely affects the transistor performance. As CMOS transistor feature sizes are shrunk, the sidewall spacer thickness is reduced as well, resulting in increased degradation of device performance due to the parasitic capacitance. Accordingly, there exists a need in the art to mitigate the deficiencies and limitations described hereinabove.

SUMMARY

A first aspect of the present invention is a device, comprising: a gate dielectric on a channel region in a semiconductor substrate; a gate electrode on the gate dielectric; respective source/drains in the substrate on opposite sides of the channel region; sidewall spacers on opposite sides of the gate electrode proximate to the source/drains; and wherein the sidewall spacers comprise a material having a dielectric constant lower than that of silicon dioxide and capable of absorbing laser radiation.

A second aspect of the present invention is a method, comprising: forming a gate dielectric on a channel region in a semiconductor substrate; forming a gate electrode on the gate dielectric; after forming the gate, forming respective source/drains in the substrate on opposite sides of the channel region; after forming the source/drains, depositing a conformal absorption layer having a dielectric constant lower than that of silicon dioxide and capable of absorbing laser radiation; irradiating the absorption layer with laser radiation; and after the irradiating, forming sidewall spacers on opposite sides of the gate electrode proximate to the source/drains from the conformal absorption layer.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Laser annealing is a process for dopant activation, while maintaining shallow source/drain junctions. An absorption layer covering the substrate is needed to facilitate a uniform heating of the substrate. The laser energy is absorbed by the absorption layer which heats up and then the heat is transferred into the substrate allowing dopant species to diffuse through the crystal lattice of the substrate and insert into the crystal lattice of the substrate. In embodiments of the present invention the absorption layer is a low dielectric constant (low-k) material that is used, after the laser annealing, to form sidewall spacers on the sidewalls of the gate electrodes, which not only reduces the gate to source/drain parasitic capacitance but also eliminates the need to completely remove the absorption layer which is extremely difficult, if not impossible to do without damaging other device structures. A low-k material is a material that has a relative permittivity of about 2.4 or less.

Figure 1:
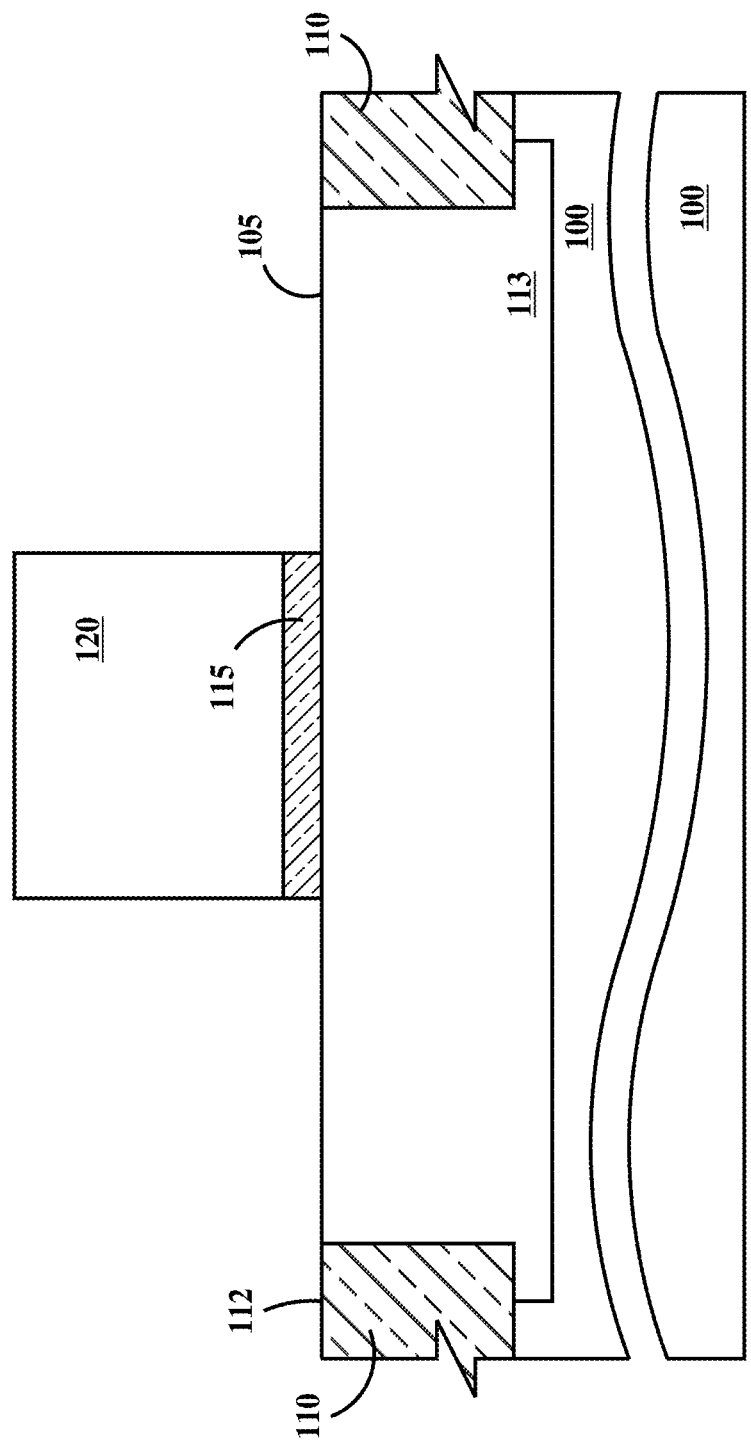
FIGS. 1 through 8 are cross-sectional views illustrating fabrication of a field effect transistor (FET) according to embodiments of the present invention.

FIGS. 1 through 8 are cross-sectional views illustrating fabrication of a field effect transistor (FET) according to embodiments of the present invention. In FIG. 1, a semiconductor substrate 100 having a top surface 105 is provided. Top surface 105 defines a horizontal direction and a vertical direction is defined as a direction perpendicular to top surface 105. Horizontal surfaces are surfaces in planes parallel to a plane defined by top surface 105. Vertical surfaces are surfaces in planes perpendicular to the plane defined by top surface 105. In one example, semiconductor substrate 100 is a bulk single-crystal silicon substrate. Formed in substrate 100 is trench isolation 110. A top surface 112 of trench isolation 110 is coplanar with top surface 105 of substrate 100. Trench isolation 110 may be formed, for example, by etching trenches into substrate 100, blanket depositing a dielectric material (e.g., silicon dioxide ($SiO_2$)) to fill the trenches and performing a chemical-mechanical polishing (CMP) to remove excess dielectric from top surface 105. Formed in substrate 100 is an optional well 113. Well 113 may be doped P type when p-channel FETs (PFETs) are to be fabricated or N-type when n-channel FETs (NFETs) are to be fabricated. When well 113 is not present, substrate 100 may be doped P type when PFETs are to be fabricated or N-type when NFETs are to be fabricated. An example of a P-type dopant is boron. Examples of N-type dopants are arsenic and phosphorous.

Formed on top surface 105 is a gate dielectric layer 115 and formed on gate dielectric layer 115 is a gate electrode 120. In one example, gate dielectric layer 115 may comprise $SiO_2$, silicon nitride ($Si_3N_4$), silicon oxynitride (SiON), a high dielectric constant (high-k) material or combinations thereof. Examples of high k materials include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$. A high K dielectric material has a relative permittivity above about 10. In one example, gate electrode 120 may comprise amorphous silicon, polycrystalline silicon a metal (e.g., aluminum, tungsten and titanium), metallic compounds (e.g., tungsten nitride, titanium nitride, tungsten silicide, nickel silicide, tungsten silicide and cobalt silicide) or combinations thereof. Metal silicides may be a layer on a top region on the gate electrode or the entire gate conductor may be formed of a metal silicide. Metal silicides may be doped with N or P type or they may be undoped. In one embodiment, the gate electrode comprises polycrystalline silicon.

Figure 2:
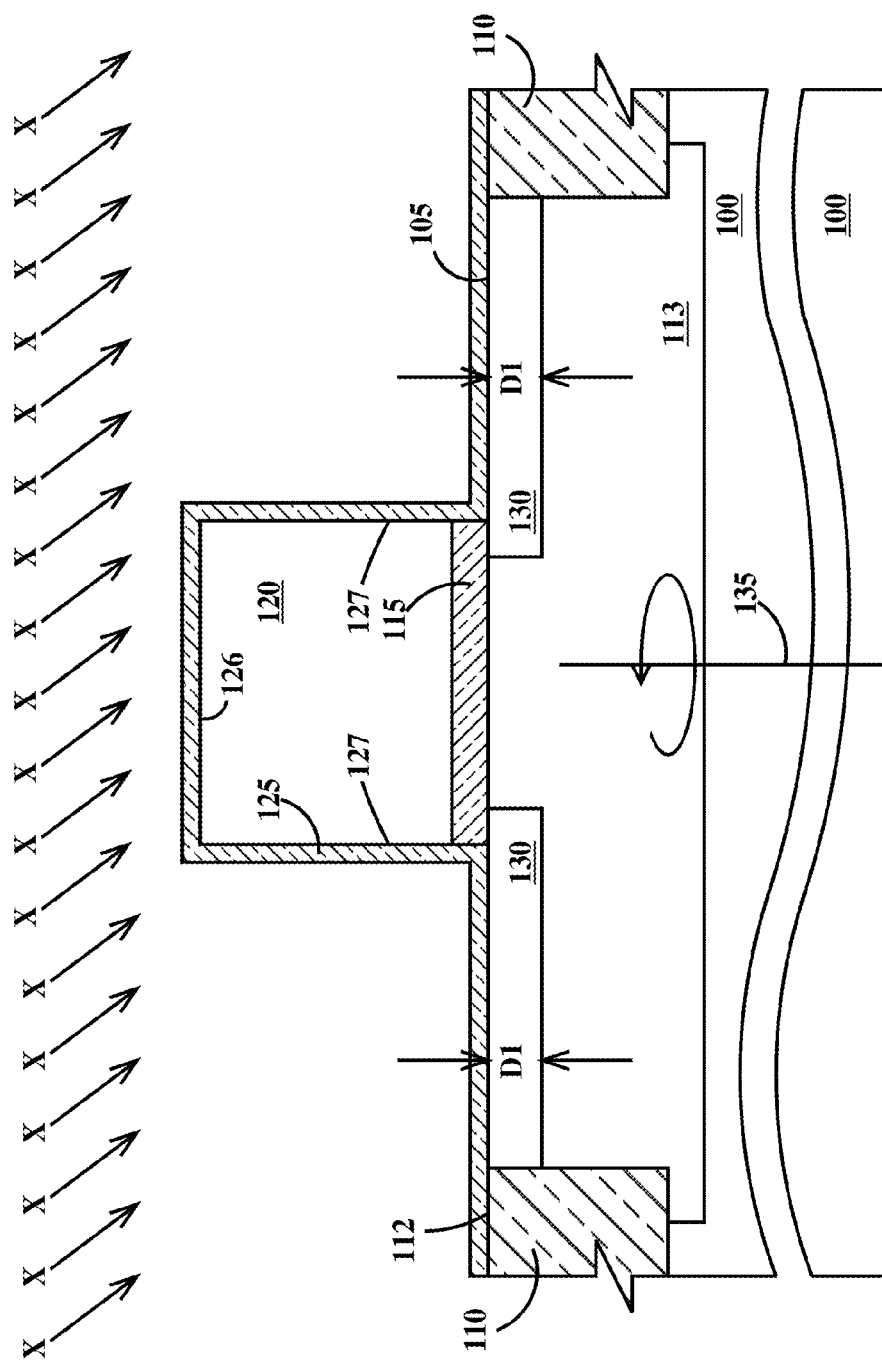

In FIG. 2, an optional conformal dielectric layer (e.g., SiO$_2$) 125 is formed on top surface 105 (not protected by gate dielectric layer 115), top surface of trench isolation 110, a top surface 126 and sidewalls 127 of gate electrode 120 and edges of gate dielectric layer 115. Dielectric layer 125 may be formed by thermal oxidation or chemical-vapor-deposition (CVD). An angled (an acute angle relative to top surface 105) ion implantation of a dopant species X is performed to form pre-source/drain extension regions 130 in well 113 (or substrate 100, if no well is present) while substrate 100 is rotated about an axis 135 that is perpendicular to top surface 105. Dopant species X is an opposite dopant type than the dopant type of well 113 or substrate 100, if no well is present). The angled implantation allows pre-source/drain extensions 130 to extend under gate electrode 120. Pre-source/drain extensions 130 are separated by a channel region 140 under gate electrode 120 (which is doped an opposite type to the pre-source/drain extensions). Alternatively, pre-source/drain extensions 130 may be formed by plasma doping or plasma immersion ion implantation.

Ion implantation is a process wherein ions are extracted from a plasma source, accelerated by a high voltage, passed through a magnetic field to select specific dopant ions of a particular weight, discussed into a beam and then the bean scanned across a wafer. Plasma immersion ion implantation is a process wherein ions, including dopant ions are formed in a plasma positioned over the wafer, and accelerated to the wafer by a DC voltage. Plasma immersion ion implantation is not as selective as ion implantation as to species implanted and cannot implant to the depths capable by ion implantation. Therefore, an ion implantation process as used herein and in the claims does not include plasma immersion ion implantation processes as used herein and in the claims despite the similarity of names.

Preferably, dopants are confined in a region with a depth D1 measured from top surface 105 in well 113 (or substrate 100, if well 113 is not present). In one example D1 is less than about 100 nm, more preferably, is less than about 50 nm, and most preferably is less than about 20 nm. Dopants may also be incorporated into gate electrode 120 during the doping process. It is well known that integrated circuit chips include many FETs and many integrated circuit chips are fabricated on a single integrated circuit. Across-chip and across-wafer uniformity for these values for D1 is extremely difficult or nearly impossible to achieve by ordinary activation processes such as rapid thermal anneal (RTA), other rapid thermal processes (RTP) and direct laser anneal because of the non-uniform heating of the substrate do to varying topology across the integrated circuit chips.

Figure 3:
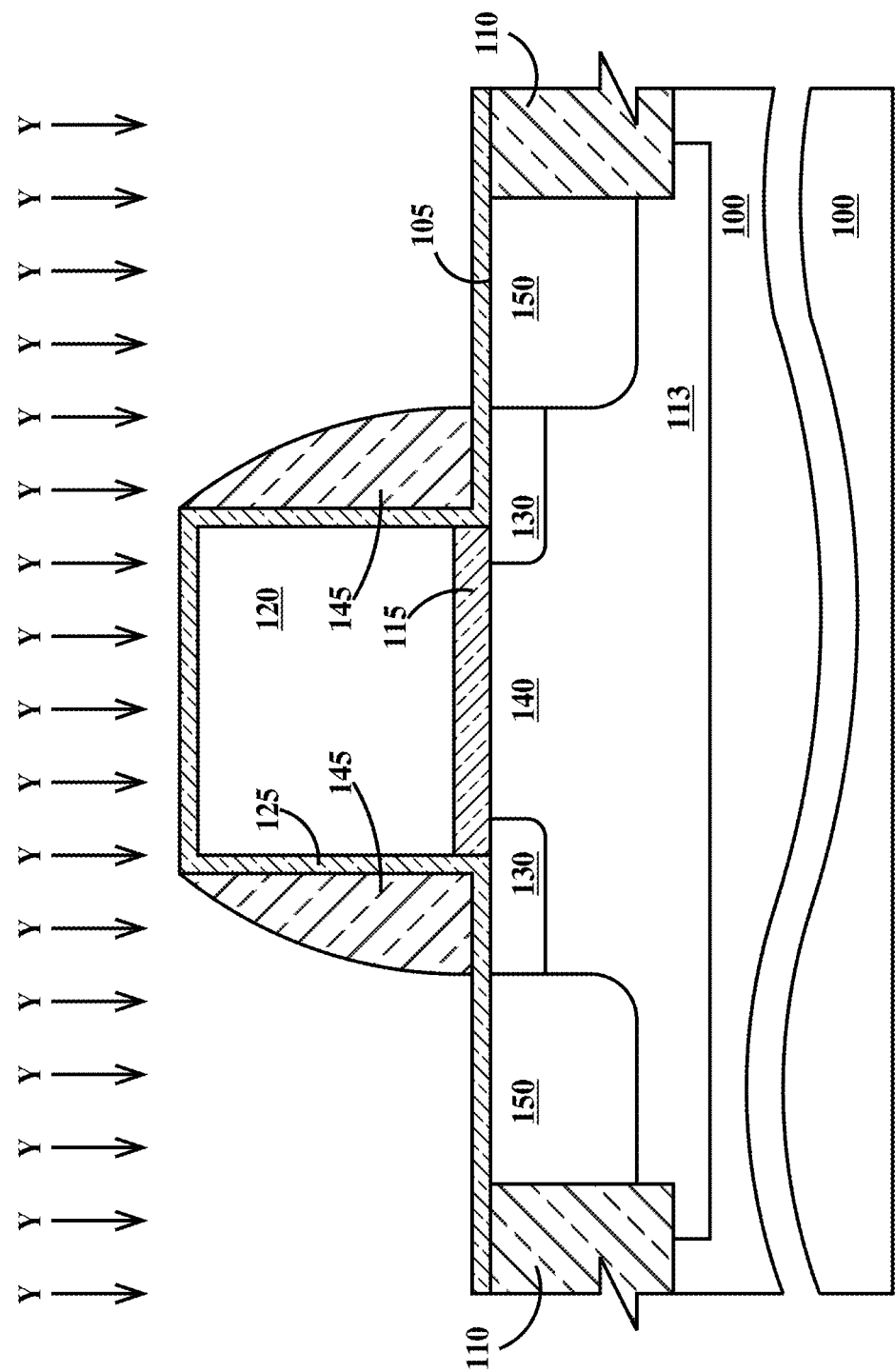

In FIG. 3, sidewall spacers 145 (e.g., Si$_3$N$_4$) are formed on the vertical surfaces of dielectric layer 125 (or are formed on vertical surfaces of gate electrode 120 if dielectric layer 125 is not present). Si$_3$N$_4$ sidewall spacers 145 may be formed by a deposition (e.g., CVD) of a conformal Si$_3$N$_4$ layer, followed by an anisotropic etch (e.g., a reactive ion etch (RIE)) to remove the Si$_3$N$_4$ layer from horizontal surfaces (those parallel to top surface 105). A perpendicular (relative to top surface 105) ion implantation of a dopant species Y is performed to form pre-source/drains regions 150 in well 113 (or substrate 100, if no well is present). Dopant species Y is a same dopant type as pre-source/drain extensions 130). Pre-source/drains 150 do not extend under gate electrode 120. Alternatively, pre-source/drains 150 may be formed by plasma doping or plasma immersion ion implantation. Again dopants may also be incorporated into gate electrode 120 during the doping process.

Figure 4A:
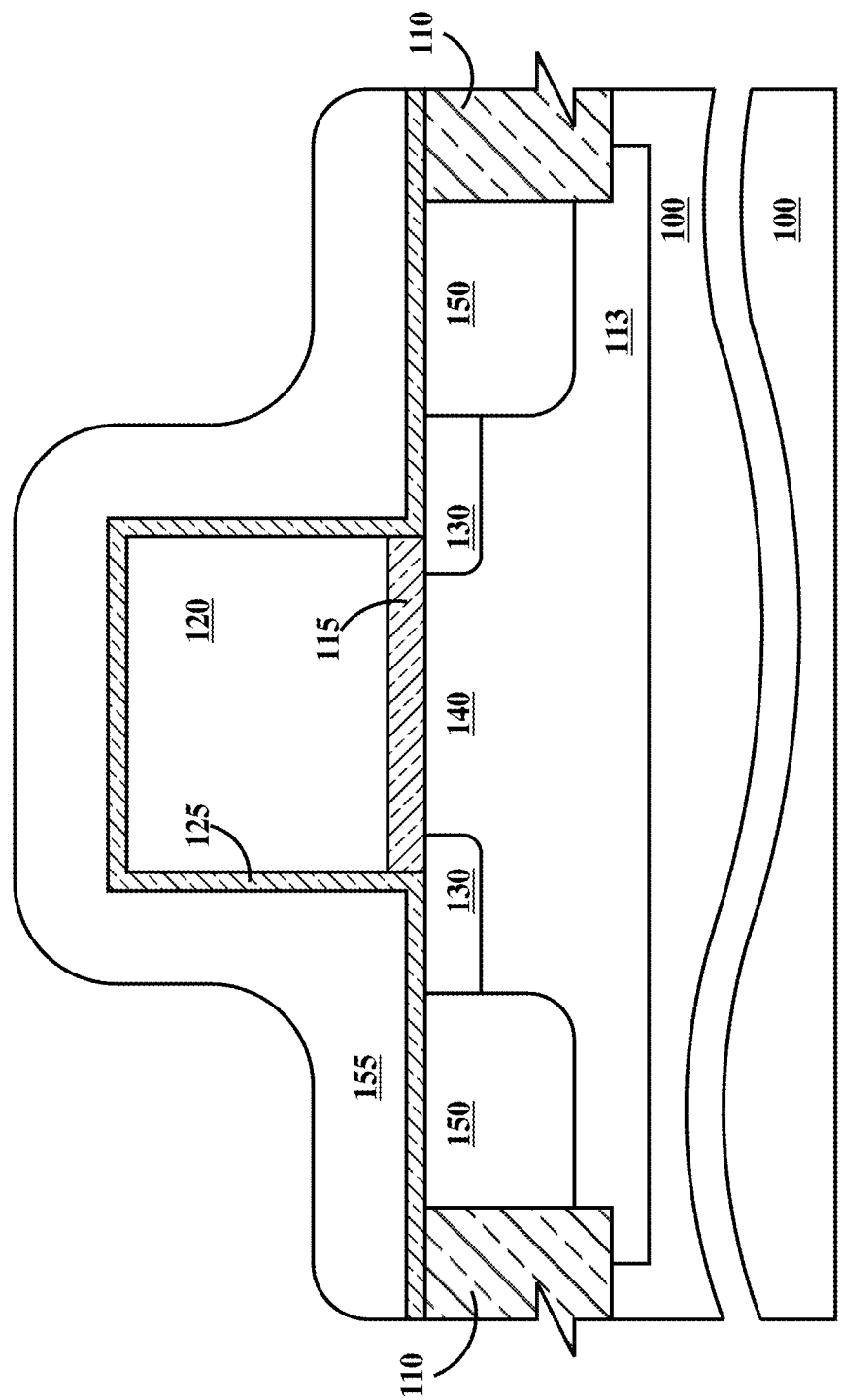

In FIG. 4A, sidewall spacers 145 (see FIG. 3) are removed, for example, using hot phosphoric acid, and an absorption layer 155 is deposited. In one example, the material of absorption layer 155 has a dielectric constant lower than the dielectric constant of silicon dioxide. Absorption layer 155 will absorb electromagnetic radiation in the laser annealing step of FIG. 5 to activate the dopants in pre-source/drain extensions 130 and pre-source/drains 150. Preferably, absorption layer 155 has a dielectric constant of less than about 3.4, more preferably less than about 3.0, and most preferably less than about 2.6. In one example, absorption layer 155 comprises amorphous carbon deposited by plasma enhanced chemical vapor deposition (PECVD) as described in US patent applications 2005/0074956 and 2005/0074986 and hereby incorporated by reference. In one example, absorption layer 155 is a carbon film deposited by high density plasma chemical vapor deposition (HDPCVD) as described in U.S. Pat. No. 6,423,384 and hereby incorporated by reference. In one example, absorption layer 155 is between about 800 Å and about 1500 Å thick. In one example, absorption layer 155 is between about 800 Å and about 1200 Å thick.

Figure 4B:
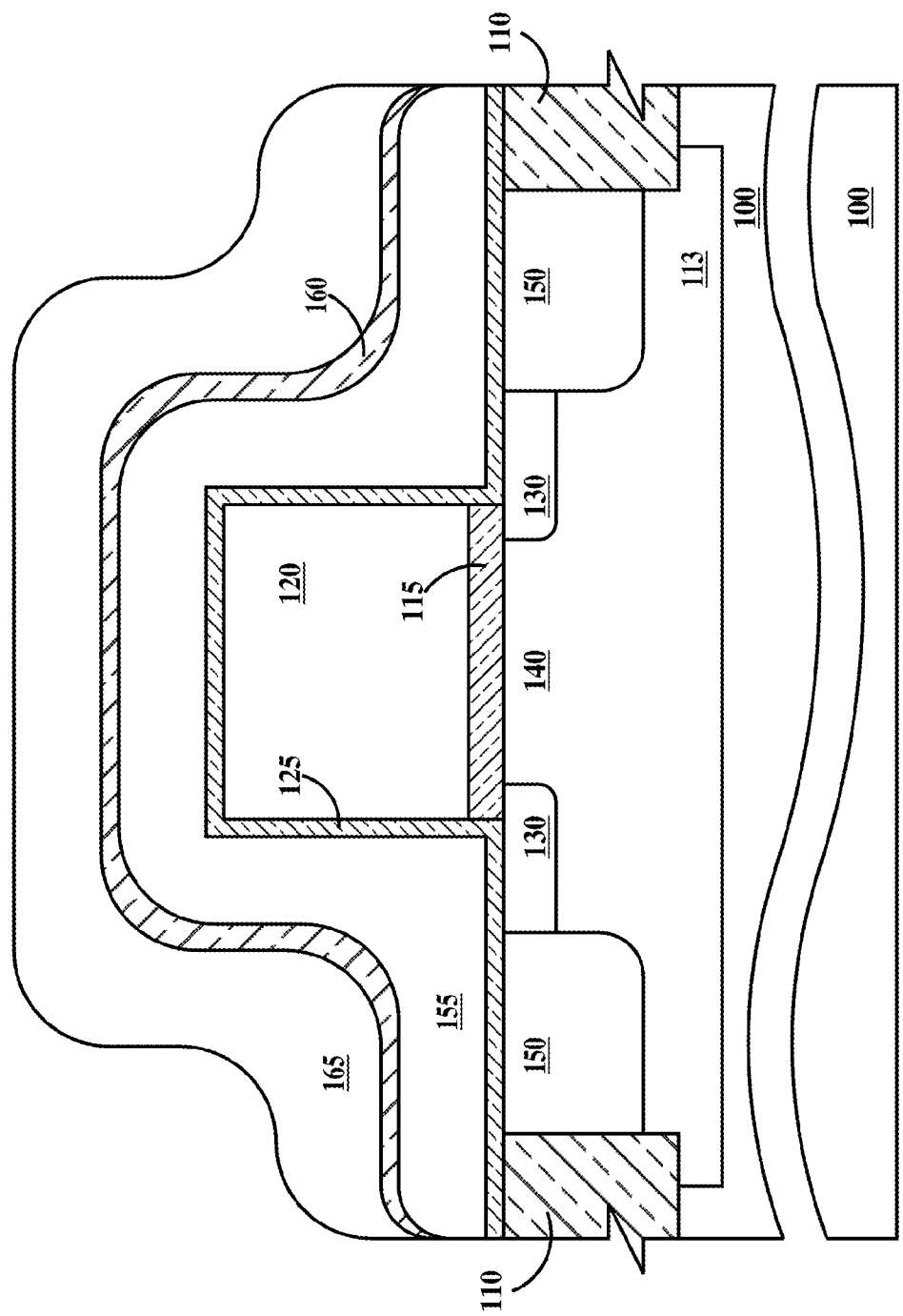

FIG. 4B illustrates an optional step in the event that a thicker absorption layer is required. In FIG. 4B, a thin dielectric liner 160 (e.g., SiO$_2$) is deposited on absorption layer 155 and then a second absorption layer 165 is deposited on dielectric liner 160. Preferably, absorption layer 165 has a dielectric constant of less than about 3.4, more preferably less than about 3.0, and most preferably less than about 2.6. In one example, absorption layer 165 comprises amorphous carbon deposited by PECVD as described in US patent applications 2005/0074956 and 2005/0074986. In one example, absorption layer 165 is a carbon film deposited by HDPCVD as described in U.S. Pat. No. 6,423,384. Absorption layer 165 may be the same material or a different material as absorption layer 155. In one example, absorption layer 165 is between about 800 Å and about 1500 Å thick. In one example, absorption layer 165 is between about 800 Å and about 1200 Å thick. Absorption layer 165 may be formed by the same method or a different method as absorption layer 155.

Figure 5:
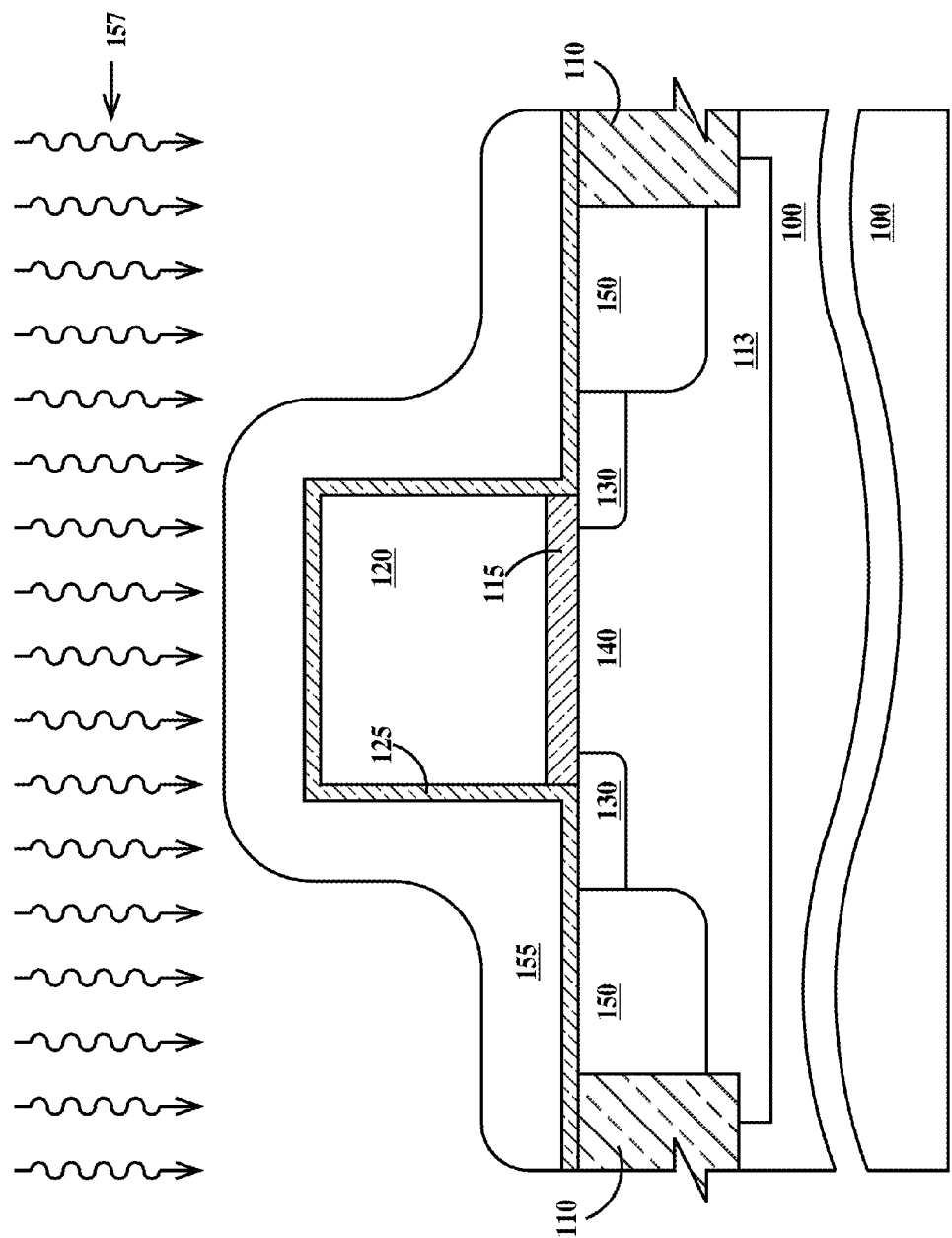

FIG. 5 continues from FIG. 4A. In FIG. 5, a laser annealing process is performed to activate dopants in pre-source/drain extension 130 and pre-source/drains 150. Absorption layer 155 absorbs laser radiation 157 and transfers the thermal energy to the underlying structures. The power, pulse, and dose of the laser irradiation may be configured to activate the dopants with minimal out-diffusion. In one example, the wavelength of the laser irradiation is between about 600 nm and about 1000 nm. In one example, the wavelength of the laser irradiation is between about 808 nm and about 810 nm. Dopants in gate electrode 120 may also be activated during the same laser annealing process.

It should be understood that the laser annealing described in reference to FIG. 5 as applied to the structure of FIG. 4A may also be applied to the structure of FIG. 4B.

Figure 6:
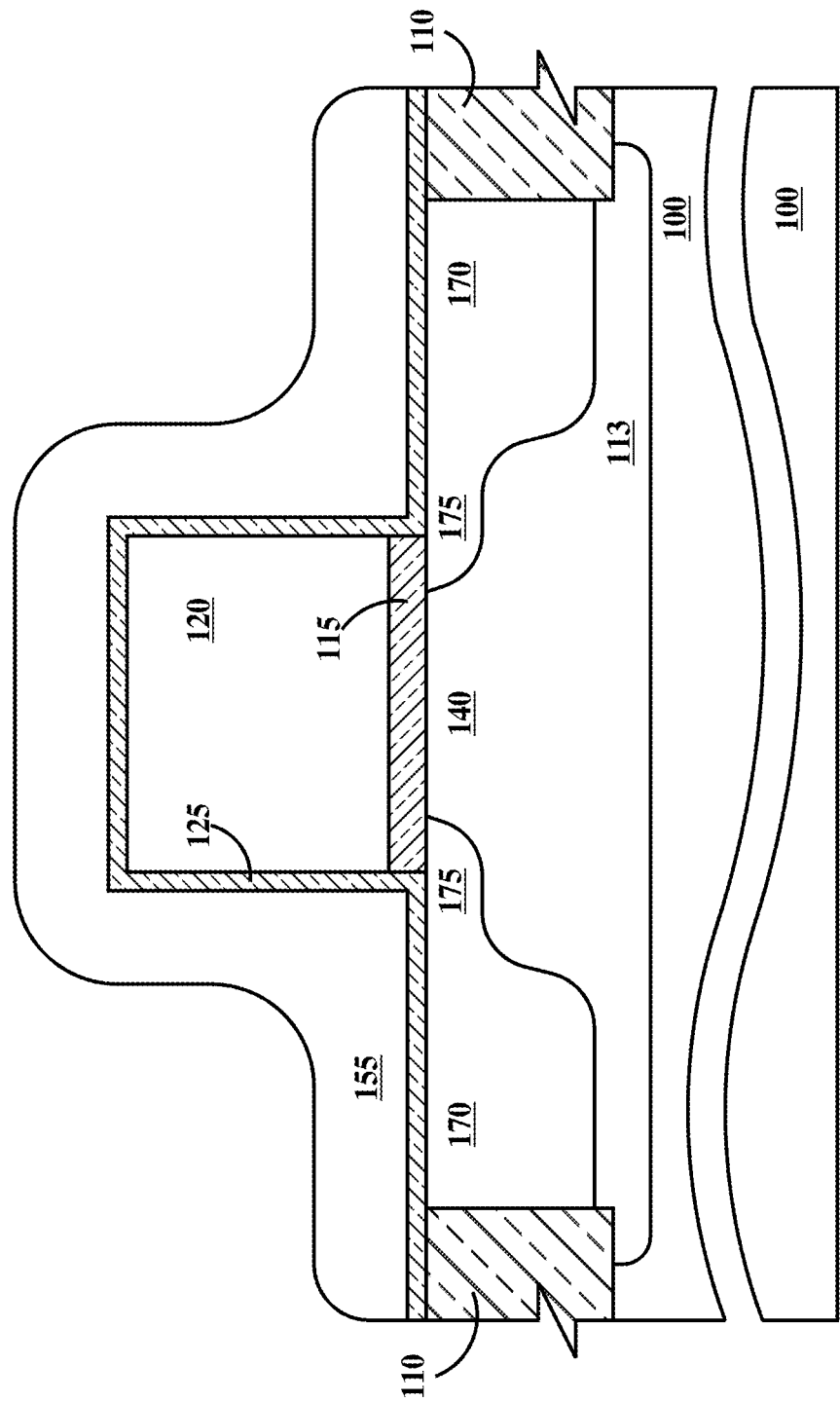

FIG. 6 continues from FIG. 5 and shows the effect of the laser annealing. After laser annealing source/drains 170 having source/drain extensions 175 have been formed from the pre-source/drain extensions 130 and pre-source/drains 150 of FIG. 4A or 4B. Also, if dielectric layer 160 and absorption layer 165 have been formed (see FIG. 4B) they are removed in FIG. 5. Absorption layer 165 may be removed, for example, using an RIE process selective over oxide and dielectric layer 160 may be removed using an RIE process selective over carbon.

Figure 7:
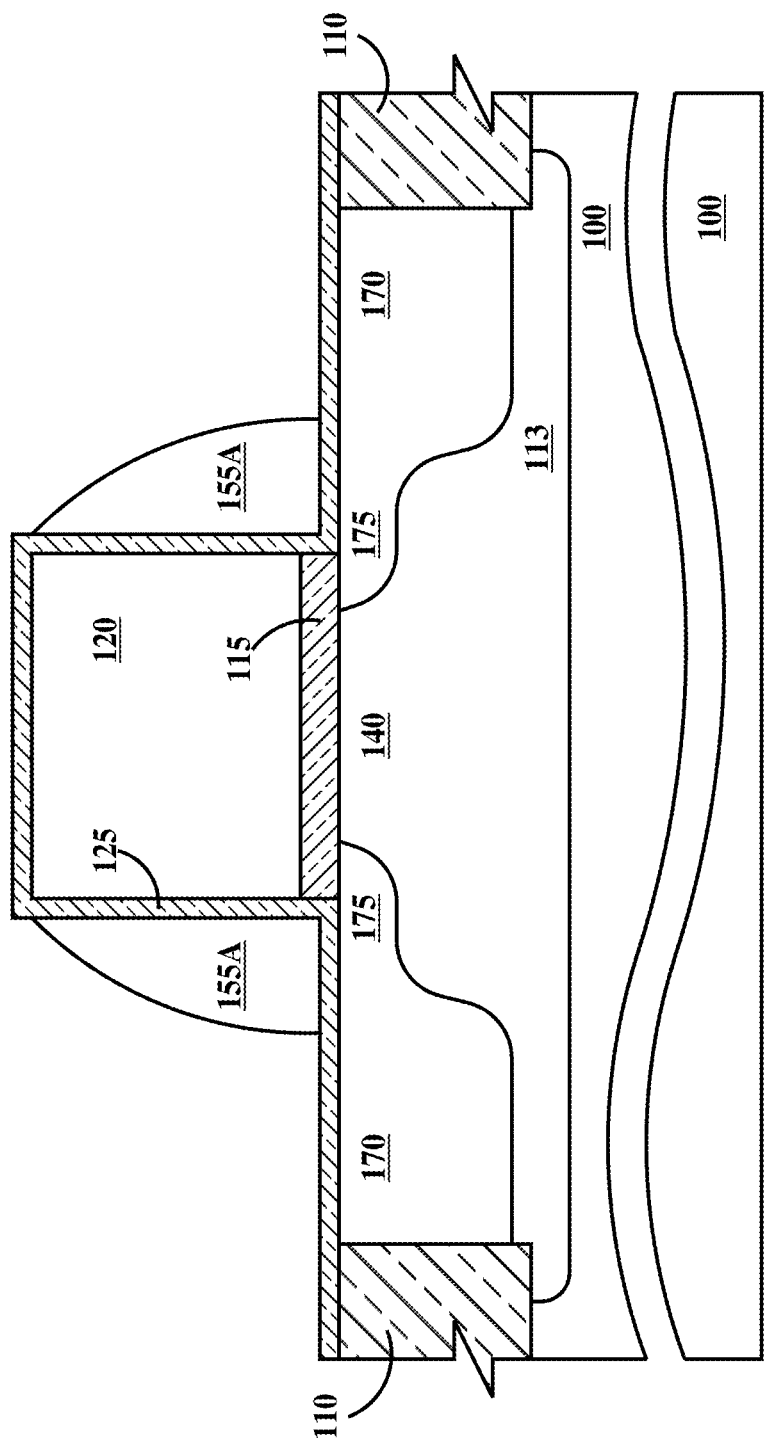

In FIG. 7, absorption layer 155 of FIG. 4A or 4B has been etched (e.g., using an RIE) to form low-k final sidewall spacers 155A on vertical surfaces of dielectric layer 125 (or gate electrode 120 if dielectric layer 125 is not present) and expose horizontal surfaces of dielectric layer 125 (or source/drains 170 and trench isolation 110 if dielectric layer 125 is not present).

Figure 8:
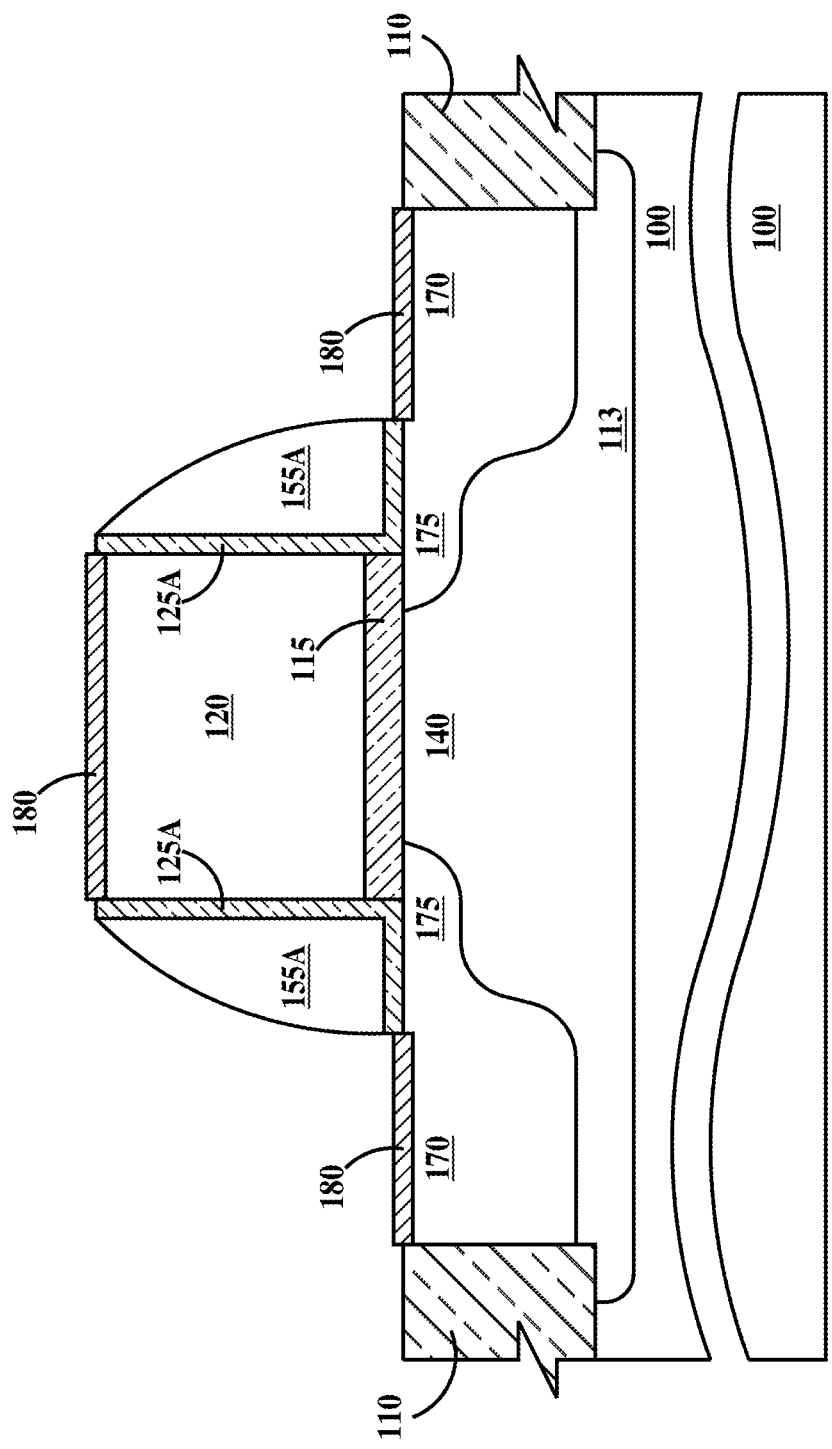

In FIG. 8, if dielectric layer 125 is present, it is removed where not protected by sidewall spacers 155A. Then a metal silicide layer 180 is formed on exposed surfaces of gate electrode 120 (in the event it is silicon) and source/drains 170. Metal silicide is not formed ion sidewall spacers 155A or trench isolation 110. A metal silicide is formed by depositing a metal layer on silicon, heating the silicon to a temperature sufficient to cause a reaction between the metal and silicon, followed by an etch process to remove unreacted metal layer. It is advantageous that the deposition, heating and etching be performed in inert or reducing environments and not oxidizing environments to prevent damage to sidewall spacers 155A.

Figure 9:
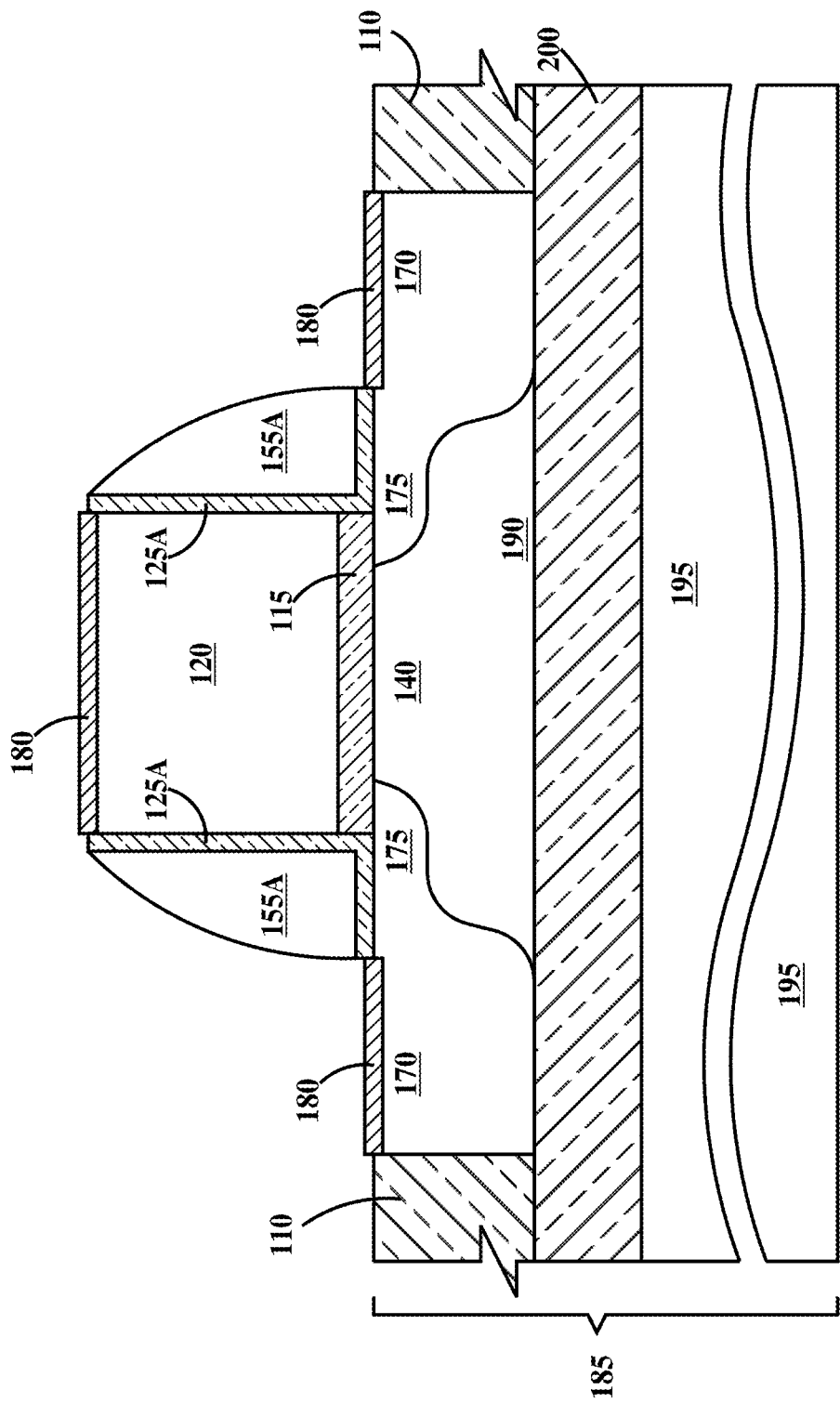
FIG. 9 is cross-sectional view illustrating the structure of FIG. 8 when fabricated on a silicon-on-insulator (SOI) substrate according to embodiments of the present invention.

FIG. 9 is cross-sectional view illustrating the structure of FIG. 8 when fabricated on an SOI substrate according to embodiments of the present invention. FIG. 9 is similar to FIG. 8 except bulk substrate 100 of FIG. 8 is replaced with an SOI substrate 185, SOI substrate 185 includes an upper silicon layer 190 separated from a support substrate 195 by a buried oxide (BOX) layer 200. Upper silicon layer 190 is single-crystal silicon and source/drains 170, source/drain extensions 175 and channel region 140 are formed in upper silicon layer 190. Upper silicon layer (and channel 140) are doped opposite type from source/drains 170 and source/drain extensions 175. Trench isolation extends from a top surface 105A of upper silicon layer 190 to abut a top surface 205 BOX layer 200. Note source/drains 170 abut BOX layer 200. Alternatively, a region of upper silicon layer 190 may intervene between source/drains 170 and BOX layer 200.

Thus, the embodiments of the present invention provide field effect transistors with low-k sidewall spacers and the method of fabricating field effect transistors with low-k sidewall spacers that mitigate parasitic gate to source/drain capacitance (due to the low dielectric constant of the final sidewall spacers) and do not require complete removal of laser absorption layer(s) which facilitate downward scaling of MOSFETs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   forming a gate dielectric on a channel region of a doped region of a semiconductor substrate and forming a gate electrode on said gate dielectric;
   after forming said gate electrode, forming a conformal dielectric layer on a top surface and sidewalls of said gate electrode and top surfaces of said doped region not protected by said gate electrode;
   after forming said conformal dielectric layer, forming pre-source/drain extensions on opposite sides of said gate electrode, said pre-source/drain extensions extending under said gate electrode;
   after forming said pre-source/drain extensions, forming dielectric sacrificial sidewall spacers on regions of said conformal dielectric layer on said sidewalls of said gate electrode and on regions of said conformal dielectric layer that extend on said doped region proximate to said dielectric sacrificial sidewall spacers;
   after forming said sacrificial sidewall spacers, forming respective pre-source/drains in said substrate on opposite sides of said channel region and then removing said dielectric sacrificial sidewall spacers;
   after removing said sacrificial sidewall spacers, depositing a dielectric conformal absorption layer on the top surface of said conformal dielectric layer, said conformal dielectric layer having a dielectric constant lower than that of silicon dioxide and capable of absorbing laser radiation;
   irradiating said dielectric conformal absorption layer with laser radiation, said irradiation activating dopants in said pre-source/drain extensions and said pre-source/drains to form source/drains having contiguous source/drain extensions, said source/drain extensions extending under said gate electrode; and
   after said irradiating, forming dielectric sidewall spacers on opposite sides of said gate electrode proximate to said source/drains from said dielectric conformal absorption layer.

2. The method of claim 1, wherein said conformal dielectric layer is formed by thermal oxidation of exposed surfaces of said gate electrode and said doped region.

3. The method of claim 1, wherein said pre-source/drains are formed by ion implantation.

4. The method of claim 1, wherein said pre-source/drains are formed by plasma doping.

5. The method of claim 1, wherein said pre-source/drains are formed by plasma immersion ion implantation.

6. The method of claim 1, wherein forming said sidewall spacers from said dielectric conformal absorption layer comprises an anisotropic etch process.

7. The method of claim 1, wherein forming said sidewall spacers from said dielectric conformal absorption layer comprises a reactive ion etch process.

8. The method of claim 1, wherein said dielectric conformal absorption layer comprises carbon.

9. The method claim 1, wherein said dielectric conformal absorption layer comprises amorphous carbon.

10. The method of claim 1, including:
    after forming said sacrificial sidewall spacers, removing said conformal layer said top surface of said gate electrode and from those regions of said doped region not protected by said sacrificial sidewall spacers and forming a layer of metal silicide on a top surface of said gate electrode and on top surfaces of said source/drains not protected by said sidewall spacers.

11. The method of claim 1, wherein said angled ion implantation is performed while rotating said semiconductor substrate about and axis perpendicular to said top surface of said semiconductor substrate.

12. The method of claim 1, wherein said doped region is a well formed in said substrate of an opposite dopant type from a dopant type of said semiconductor substrate.

13. The method of claim 1, wherein said gate dielectric is selected from the group consisting of $Ta_2O_5$, $BaTiO_3$, $HfO_2$, $ZrO_2$, $Al_2O_3$, $HfSi_xO_y$ and $HfSi_xO_yN_z$.

14. The method of claim 1, wherein said dielectric conformal absorption layer has a dielectric constant less than 3.4.

15. The method of claim 1, wherein said dielectric conformal absorption layer has a dielectric constant less than 2.6.

16. The method of claim 1, wherein said dielectric conformal absorption layer is amorphous carbon formed by plasma enhanced chemical vapor deposition or is a carbon film formed by high density chemical vapor deposition.

17. The method of claim 1, wherein said pre-source/drain extensions are formed using an angled ion implantation at an acute angle relative to a top surface of said semiconductor substrate.

18. The method of claim 1, wherein said dielectric conformal absorption layer is between 800 Å and 1500 Å thick.

19. The method of claim 1, wherein the wavelength of said laser radiation is between 600 nm and 1000 nm.

20. The method of claim 1, wherein the wavelength of said laser radiation is between 808 nm and 810 nm.

21. The method of claim 1, wherein said doped region is a region of an upper single-crystal silicon layer on a top surface of a buried oxide layer on a top surface of a support substrate.

22. The method of claim 1, wherein said doped region is bounded by dielectric trench isolation formed in said semiconductor substrate.

23. The method of claim 1, including:
after forming said dielectric conformal absorption layer and before said irradiating, depositing a dielectric liner on the top surface of said dielectric conformal absorption layer and forming an additional dielectric conformal absorption layer on a top surface of said dielectric liner.

* * * * *